United States Patent [19]
Yoshida et al.

[11] Patent Number: 5,821,625
[45] Date of Patent: Oct. 13, 1998

[54] STRUCTURE OF CHIP ON CHIP MOUNTING PREVENTING FROM CROSSTALK NOISE

[75] Inventors: Takayuki Yoshida; Takashi Otsuka; Hiroaki Fujimoto; Tadaaki Mimura; Ichiro Yamane, all of Osaka; Takio Yamashita; Toshio Matsuki, both of Kyoto; Yoshiaki Kasuga, Shiga, all of Japan

[73] Assignees: Matsushita Electric Industrial Co., Ltd., Kadoma; Matsushita Electronics Corp., Takatsuki, both of Japan

[21] Appl. No.: 636,651

[22] Filed: Apr. 23, 1996

[30] Foreign Application Priority Data

Apr. 24, 1995 [JP] Japan .................................. 7-098200
Nov. 7, 1995 [JP] Japan .................................. 7-288564

[51] Int. Cl.⁶ .......................... H01L 23/552; H01L 23/48; H01L 23/02
[52] U.S. Cl. .......................... 257/777; 257/686; 257/659; 257/660
[58] Field of Search .................................. 257/777, 659, 257/660, 686

[56] References Cited

U.S. PATENT DOCUMENTS

| 4,763,188 | 8/1988 | Johnson | 257/777 |
| 4,811,082 | 3/1989 | Jacobs et al. | 257/777 |
| 5,508,565 | 4/1996 | Hatakeyama et al. | 257/773 |
| 5,596,225 | 1/1997 | Mathew et al. | 257/777 |
| 5,656,856 | 8/1997 | Kweon | 257/686 |

FOREIGN PATENT DOCUMENTS

| 59-67658 | 4/1984 | Japan | 257/660 |
| 61-148826 | 7/1986 | Japan | 257/777 |
| 4-340758 | 11/1992 | Japan | 257/777 |

*Primary Examiner*—Jerome Jackson
*Assistant Examiner*—Teresa M. Arroyo
*Attorney, Agent, or Firm*—Wenderoth, Lind & Ponack, L.L.P.

[57] ABSTRACT

The present invention reduces crosstalk, which occurs as a result of interference between signals running in each of respective wiring layers of a first semiconductor chip and a second semiconductor chip stacked surface to surface with a small gap. The semiconductor device includes a first semiconductor chip 1 having a first electrode pad 2 and a first wiring layer 9 in the main surface, and a second semiconductor chip 5 having a second electrode pad 6 and a second wiring layer 10 in the main surface confronting the first semiconductor chip. A bump 4 is provided for electrically coupling the first electrode pad 2 and the second electrode pad 6 together. An insulation layer 8 is disposed between the main surfaces of first semiconductor chip 1 and second semiconductor chip 5. An electro-conductive layer 7 is disposed between the main confronting surfaces of the first semiconductor chip and the second semiconductor chip.

3 Claims, 16 Drawing Sheets

5,821,625

1

STRUCTURE OF CHIP ON CHIP MOUNTING PREVENTING FROM CROSSTALK NOISE

BACKGROUND OF THE INVENTION

The present invention relates to semiconductor devices which are assembled as a multichip module or the like, in the field of electronic components mounting.

To meet the demand for making electronic appliances smaller, providing higher functions and higher operating speed, an effort is being made to put a plurality of electronic components into one unit to form a module. As a so-called multichip module, it has been proposed to mount a semiconductor chip on an other semiconductor chip and house them together in a single encapsulation to be mounted on a printed circuit board.

In the following, explanation is made of a conventional semiconductor device in which plural semiconductor chips are stacked. FIG. 18 shows a cross sectional structure of the conventional semiconductor device, and FIG. 19 shows the process steps of coupling the chips.

In a conventional structure, a first semiconductor chip 91 having a first electrode pad 92 and a passivation layer 94 is mounted on a second semiconductor chip 96 having a second electrode pad 97 and a passivation layer 99. The first electrode pad 92 is coupled with the second electrode pad 97 via barrier metals 93 and 98, each formed on the respective electrode, by means of the flip chip mounting method using a metal bump 95 comprised of a solder. In a case when forming the bump 95 by electroplating, normally barrier metals 93 and 98 are disposed between bump 95 and each of first electrode pad 92 and second electrode pad 97, in order to ensure contact between bump 95 and these electrode pads 92, 97. Furthermore, the gap between first semiconductor chip 91 and second semiconductor chip 96 is filled with an insulation resin 100 of epoxy group, acrylic group or silicone group.

Next, explanation is made of a process to couple first semiconductor chip 91 with second semiconductor chip 96. As shown in process (a) of FIG. 19, a barrier metal layer 93 of Ti, Pd or Au is formed by the EB evaporation method or the like. Then, the surface is covered with a photo resist 101 using the technology of photolithography, excluding an area of first electrode pad 92, as shown in process (b). Then, as shown in process (c), Pb or Sn solder which is to become bump 95 is formed on barrier metal layer 93 above electrode pad 92 by means of electroplating or the like. After removing photo resist 101, barrier metal layer 93 is etched off with aqua regia, fluoric acid, etc. leaving an area above the electrode pad in, process (d). Barrier metal 98 is formed also on second semiconductor chip 96 by the same process.

Next, as shown in process (e), bump 95 of first semiconductor chip 91 is aligned to barrier metal 93 of second semiconductor chip 96, and then the two are coupled together by heating or by pressing. Then, as shown in process (f), insulation resin 100 is provided between first semiconductor chip 91 and second semiconductor chip 96, and cured; thus the mounting of first semiconductor chip 91 on second semiconductor chip 96 is completed.

In the conventional structure as explained above, however, the occurrence of crosstalk noise is inevitable because of interference between signals flowing in the wiring layer formed on the main surface of each respective semiconductor chip, if the gap between first semiconductor chip and second semiconductor chip is to be made narrower than 100 $\mu$m.

In order to suppress the size of crosstalk noise signal within 10% of that of the source signal, it has been reported

2 that two semiconductor chips need to be separated by more than 300 $\mu$m even when the two are placed horizontally side by side. Therefore, when stacking two semiconductor chips vertically a gap of more than several hundreds um seems to be necessary and to narrow the gap to be less than 100 $\mu$m has been a hard task to attain.

SUMMARY OF THE INVENTION

The present invention aims to present a semiconductor device wherein the occurrence of crosstalk noise between a wiring layer of a first semiconductor device and a wiring layer of a second semiconductor device is reduced, and a manufacturing method thereof.

A semiconductor device according to an embodiment of the present invention comprises a first semiconductor chip having a first electrode pad and a first wiring layer on the main surface, a second semiconductor chip having a second electrode pad located at a corresponding place and a second wiring layer on the main surface facing to the first semiconductor chip, a connecting member for electrically coupling the first electrode pad with the second electrode pad, an insulation member disposed between the main surfaces of first semiconductor chip and second semiconductor chip facing to each other, and an electro-conductive member disposed between the main surfaces of first semiconductor chip and second semiconductor chip facing to each other.

A semiconductor device manufacturing method according to an embodiment of the present invention comprises a process to dispose a first semiconductor chip and a second semiconductor chip with their main surfaces facing to each other, a process to dispose an insulation member between the first semiconductor chip and the second semiconductor chip, a process to dispose an electro-conductive member between the first semiconductor chip and the second semiconductor chip, and a process to electrically couple a first electrode pad and a second electrode pad with a connecting member.

In the above described constitution, the crosstalk noise which occurs between the wiring layers can be significantly reduced even when the layers are placed close to each other, as an electro-conductive member is disposed between the first semiconductor chip and the second semiconductor chip. For example, even if the gap between first semiconductor chip and second semiconductor is narrowed to be less than 100 $\mu$m, the value of crosstalk noise can be suppressed within 10% of the value of source signal.

A semiconductor device according to other embodiment of the present invention is comprised of a first semiconductor chip having a first eletrode pad, a first wiring layer and a first elements region on the main surface; and a second semiconductor chip having a second electrode pad located at a corresponding place, a second wiring layer and a second elements region on the main surface facing to the first semiconductor chip; wherein the second semiconductor chip has a larger chip area than that of the first semiconductor chip, and the second wiring layer and the second elements region are formed in an area where they do not face the first wiring layer and the first elements region. In this constituition, the occurrence of crosstalk noise is suppressed as the wiring layer and the elements region of each chip are disposed so as not to face to each other.

A semiconductor device according to another embodiment of the present invention is comprised of a first semiconductor chip and a second semiconductor chip disposed with their main surfaces facing to each other, wherein a wiring of a first wiring layer formed in the first semiconductor chip and a wiring of a second wiring layer formed in the second semiconductor chip are disposed in a state crossing to each other without having contact, viz. crossing at right angle or some other angle to each other. By disposing the two wirings so as not to form a parallel arrangement, the crosstalk noise becomes difficult to occur. Thus, the crosstalk noise can be reduced to a level low enough not to cause an erroneous operation of a semiconductor device.

A semiconductor device according to a further diverse embodiment of the present invention is comprised of a first semiconductor chip and a second semiconductor chip disposed with their main surfaces facing to each other, wherein the difference between the driving voltage of the first semiconductor chip and that of the second semiconductor chip has a smaller value than threshold voltage, which determines the ON or OFF, of a semiconductor chip whose driving voltage is lower of the two. Thus, the crosstalk noise can be suppressed also by making the difference of driving voltages between the two chips smaller than threshold voltage value of either one of the chips the driving voltage of which is lower.

DESCRIPTION OF THE PREFERRED EMBODIMENTS

In the following, embodiments of the present invention are described referring to Figs. with reference to the drawings.

(Embodiment 1)

Figure 1:
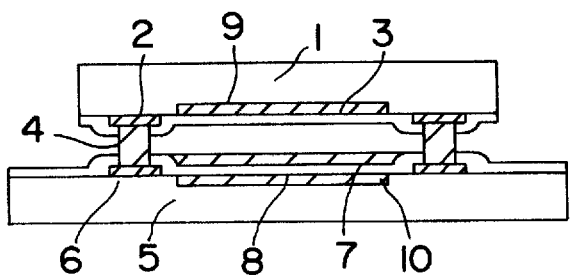
FIG. 1 shows a cross sectional view of a semiconductor device according to a first embodiment of the present invention.

FIG. 1 shows semiconductor chips in a semiconductor device according to a first embodiment of the present invention. The semiconductor device comprises a first semiconductor chip 1 having a first electrode pad 2, a first wiring layer 9 and a passivation layer 3 covering the surface excluding the first electrode pad 2; and a second semiconductor chip 5 having a second electrode pad 6, on which the first semiconductor chip is mounted. On the second semiconductor chip 5, an insulation layer 8 is formed to cover the surface except second electrode pad 6, and an electro-conductive layer 7 is formed above insulation layer 8 to cover an area corresponding to a second wiring layer 10. First electrode pad 2 and second electrode pad 6 are electrically coupled together by a bump 4 constituting an extruding electrode. When encapsulating the semiconductor device, the gap between first semiconductor chip 1 and second semiconductor chip 5 may be filled, whenever necessary, with an insulation resin of epoxy group, acrylic group or silicone group. For instance, when mounting the semiconductor device in the bare chip state on a printed circuit board, an insulation resin is filled in between the semiconductor chips 1 and 5. When encapsulating with a lead frame, insert the semiconductor device is inserted within a mold and an insulation resin is poured into the mold.

Figure 2:
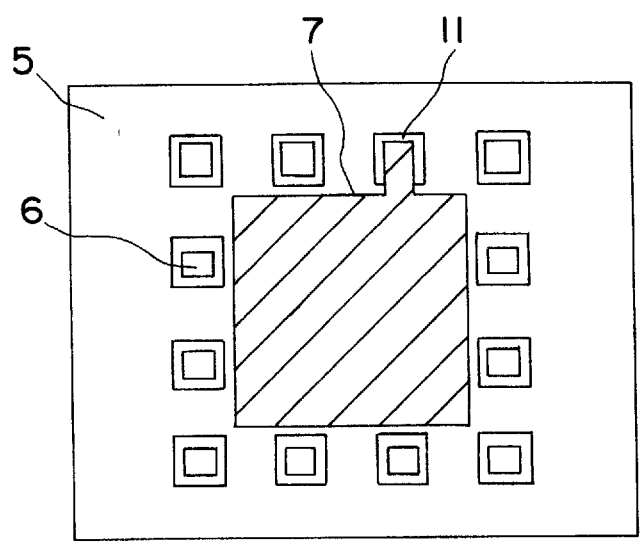
FIG. 2 shows a top view of a second semiconductor chip of the first embodiment.
Figure 3A:
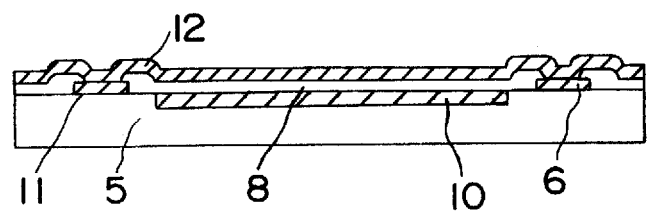
FIG. 3 shows process steps of a first semiconductor device manufacturing method of the semiconductor device according to the first embodiment of the present invention.
Figure 3B:
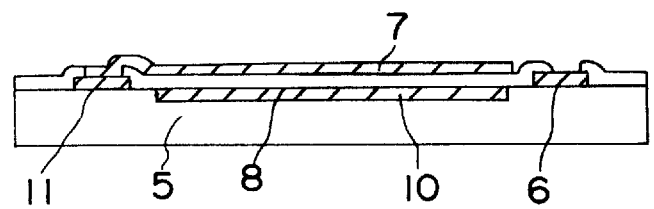
Figure 3C:
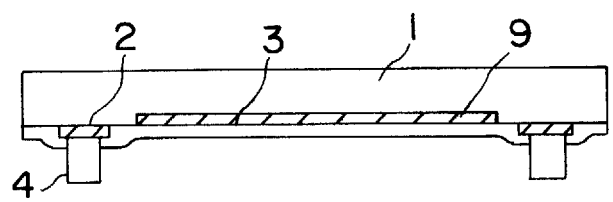
Figure 3D:
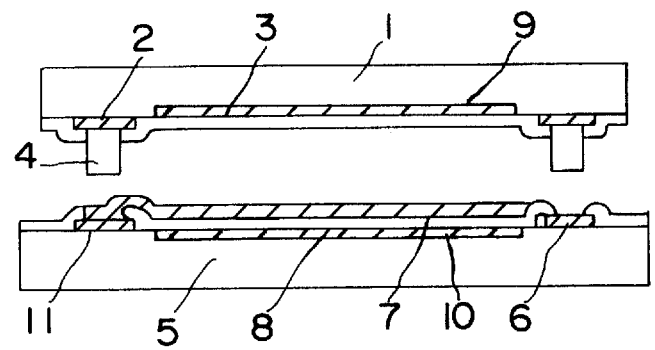
Figure 3E:
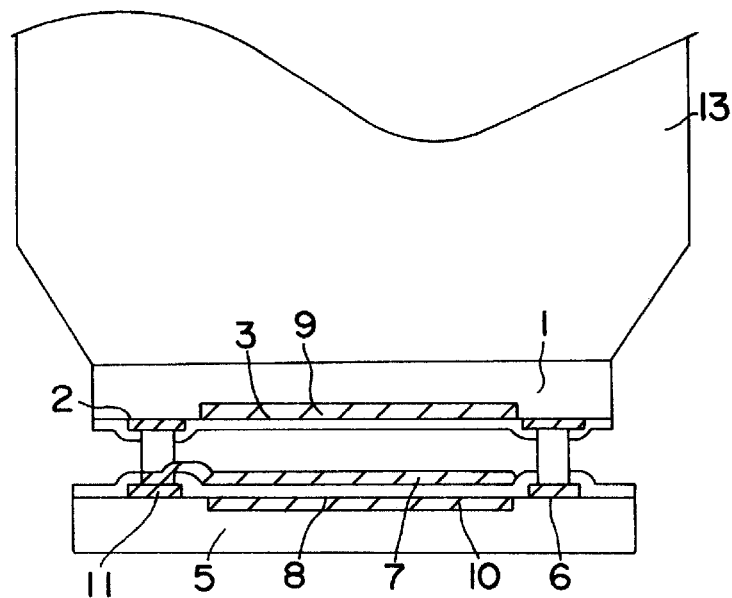
Figure 4A:
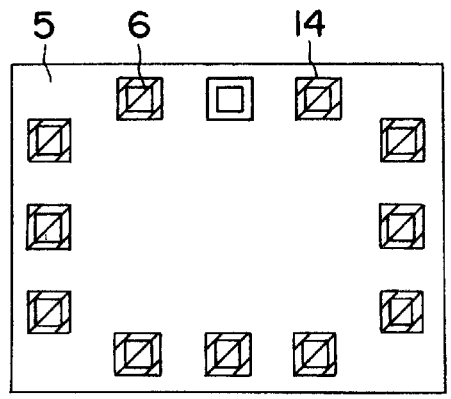
FIG. 4 shows process steps of a second semiconductor device manufacturing method of the semiconductor device according to the first embodiment.
Figure 4B:
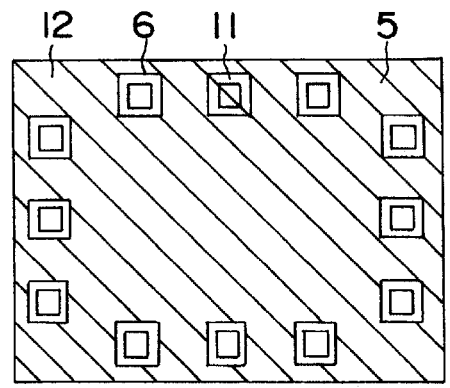
Figure 4C:
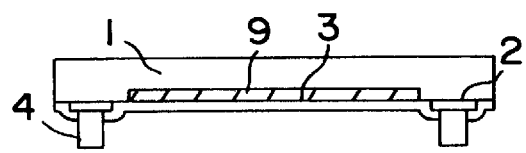
Figure 4D:
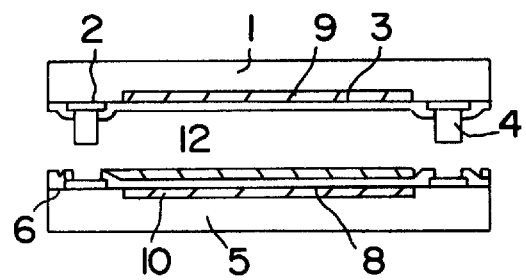
Figure 4E:
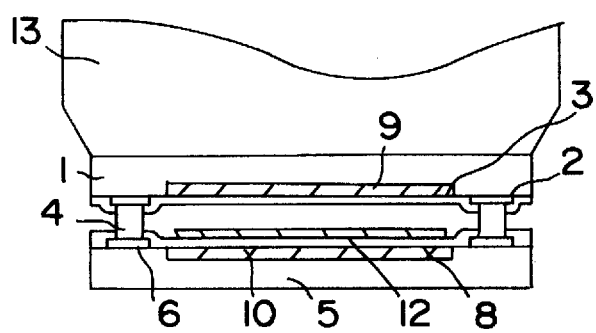

FIG. 2 shows the arrangement of second electrode pads 6 and electro-conductive layer 7 on second semiconductor chip 5. Electro-conductive layer 7 has an extended area or a ground terminal 11 which is coupled with one of second electrode pads 6. The ground terminal 11 is not a must; however, it is recommended to form a ground terminal 11, and the effect of reducing crosstalk noise is ensured by grounding the terminal 11.

Electro-conductive layer 7 may be formed on passivation layer 3, instead of on insulation layer 8; or on both insulation layer 8 and passivation layer 3. What is required for electro-conductive layer 7 is to cover at least one of first wiring layer 9 and second wiring layer 10.

FIG. 3 shows a method of coupling a first semiconductor chip 1 and a second semiconductor chip 5 together.

In the first place, an electro-conductive film 12 of an Al-Si-Cu alloy is formed on insulation layer 8 by sputtering, as shown in process (a). Then, in order to obtain an electro-conductive layer 7 having a shape shown in FIG. 2, the unnecessary part of electro-conductive film 12 is removed by dry-etching, after covering the opening of a second electrode pad 6, which is to make itself a ground terminal 11, and an area above wiring layer 10 with a photo resist as in process (b). In a case when ground terminal 11 is not needed, it may be removed.

As to material for the electro-conductive film 12, because of a fact that the wiring is comprised of an Al-Si-Cu alloy, use of the same material is advantageous in manufacturing. However, the electro-conductive film 12 is not limited to the material, and other electro-conductive materials may be used.

Next, as shown in process (c), a bump 4 or a metal extrusion of e.g. Ni-core Au bump is formed by electroless plating on first electrode pad 2 of first semiconductor chip 1. And then, first semiconductor chip 1 and second semiconductor chip 5 are disposed so that bump 4 and second electrode pad 6 face each other, as shown in process (d). And, as shown in process (e), first semiconductor chip 1 and second semiconductor chip 5 are pressed together and heated by a pressing/heating jig 13. Pressure then is within a range from 0.1 g to 100 g per one bump, and heating temperature is within a range from 250° C. to 450° C. By the pressing/heating, the Au-Al alloy junction is formed. In the case of Au-Au junction, viz. when Ni-core Au bump is formed on both of electrode pads 2, 6, or when second electrode pad 6 is coated with Au, the pressing/heating conditions remain the same as in the case of Au-Al alloy junction. Conditions for the case of solder alloy junction are: heating temperature from 60° C. up to 250° C.; pressure from the self weight of first semiconductor chip 1 up to several grams. Besides these alloy junction methods, the flip chip method such as M B B(micro bump bonding) method, well known as C O G(chip on glass) method, wherein junction is made via insulation resin, may be used.

As described above, a semiconductor device according to this embodiment comprises two semiconductor chips (first semiconductor chip and second semiconductor chip) coupled via a metal extrusion, and an electro-conductive layer 7 disposed between said two semiconductor chips. Therefore, the crosstalk noise is reduced. As the electro-conductive layer 7 can be formed during the process steps of a conventional semiconductor device manufacturing method, there is no need of introducing an additional production facility.

FIG. 4 shows another coupling method, wherein the method of forming an electro-conductive layer is different from that of FIG. 3. In the first place, as shown in process (a) of FIG. 4, all of the electrode pads 6, excluding the one to be connected to ground terminal 11, are covered with photo resist 14. Next, as shown in process (b), electro-conductive film 12 composed of Sn/Pd/Ni three layers is formed by electroless plating over insulation layer 8. Photo resist 14 is removed, and then conductive film 12 remains. The conductive film 12 is utilized as it is as the electro-conductive layer. The succeeding processes (c), (d) and (e) are the same as (c), (d) and (e) processes of FIG. 3. What is different from the case of FIG. 3 is that the conductive layer 12 is formed by the electroless plating and that the conductive layer 12 is provided not only in an area above second wiring layer 10, but also covering an area surrounding second electrode pads 6. As to electro-conductive layer 12, those which can be plated through electroless plating, e.g. Ag or Sn metal layer, or Sn/Pd two layers or the like may be used, besides the Sn/Pd/Ni layers. Also, Sn-Pd or Sn-Pd-Ni alloy layer obtained by heating these two or three layers may be used. Further, it is not essential for the electro-conductive layer 12 to be formed to cover the entire surface excluding second electrode pads 6; the electro-conductive layer may be formed for an area covering at least first wiring layer 9 and second wiring layer 10.

The coupling method as shown in FIG. 4 does not require that the electro-conductive layer be formed during the manufacturing process of a semiconductor device. Therefore, the electro-conductive layer can be formed at ease on any finished bare chips if there is a facility available for electroless plating.

Although the coupling methods of FIG. 3 and FIG. 4 exemplified a Ni-core Au bump for the bump 4, an Au bump, a solder bump consisting of Sn-Pb alloy, In-Sn alloy, etc. may of course be used. Besides the above, a transfer bump method may be employed. Diameter of the Ni-core Au bump and Au bump is from 5 μm to 100 μm, and the solder bump is approximately 100 μm. If the gap between electrode pads 2 and 6 are to be made larger in order to further reduce the crosstalk noise, it is recommended to form a bump also on electrode pad 6 of second semiconductor chip 5. In this case, second semiconductor chip 5 undergoes the process (c), in advance of processes (a) and (b).

(Embodiment 2)

Figure 5:
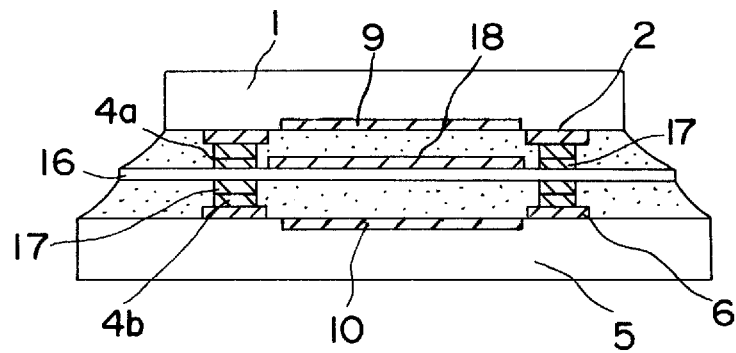
FIG. 5 shows a cross sectional view of a semiconductor device according to a second embodiment of the present invention.

FIG. 5 shows a cross sectional structure of a semiconductor device according to a second embodiment of the present invention. The constituent components in FIG. 5 having the same functions as those in FIG. 1 are indicated by the same symbols, and explanations thereof are omitted. In the semiconductor device of FIG. 5, an insulation film 16 carrying an electro-conductive layer 18 is disposed between first semiconductor chip 1 and second semiconductor chip 5. First electrode pad 2 and second electrode pad 6 are coupled, via bumps 4a, 4b, by a metal extrusion 17 formed on insulation film 16.

Figure 6:
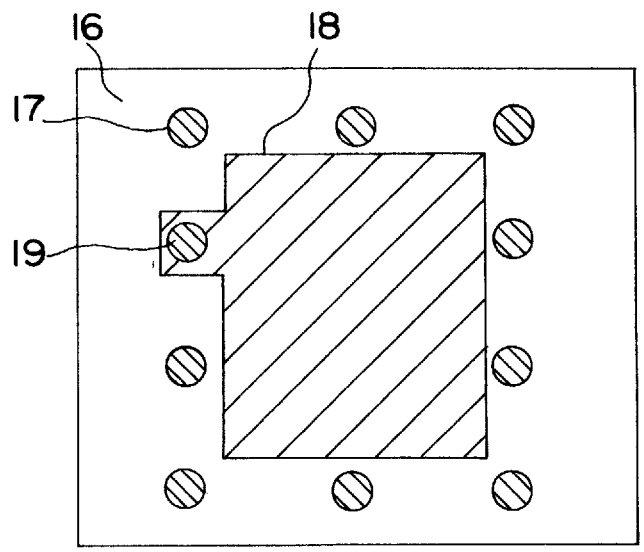
FIG. 6 shows a top view of a second semiconductor chip of the second embodiment.
Figure 7A:
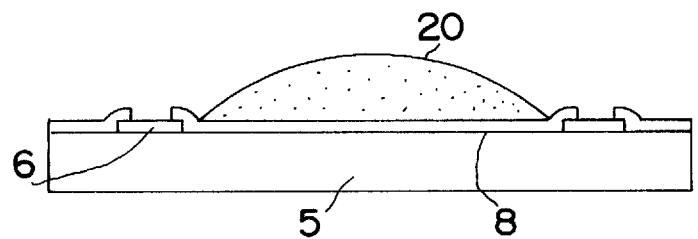
FIG. 7 shows process steps of a semiconductor device manufacturing method of the semiconductor device according to the second embodiment.
Figure 7B:
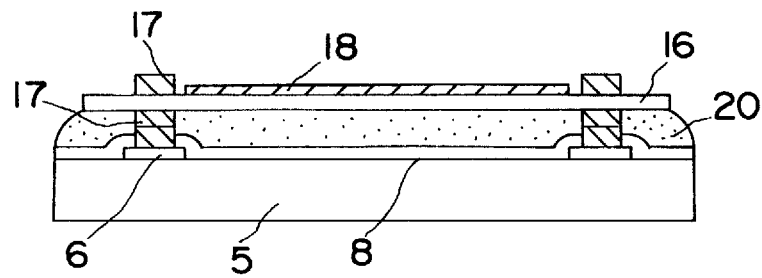
Figure 7C:
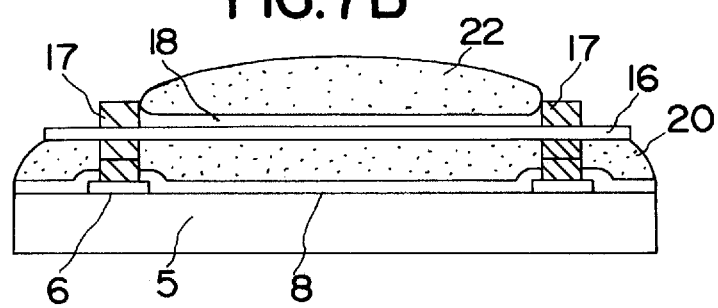
Figure 7D:
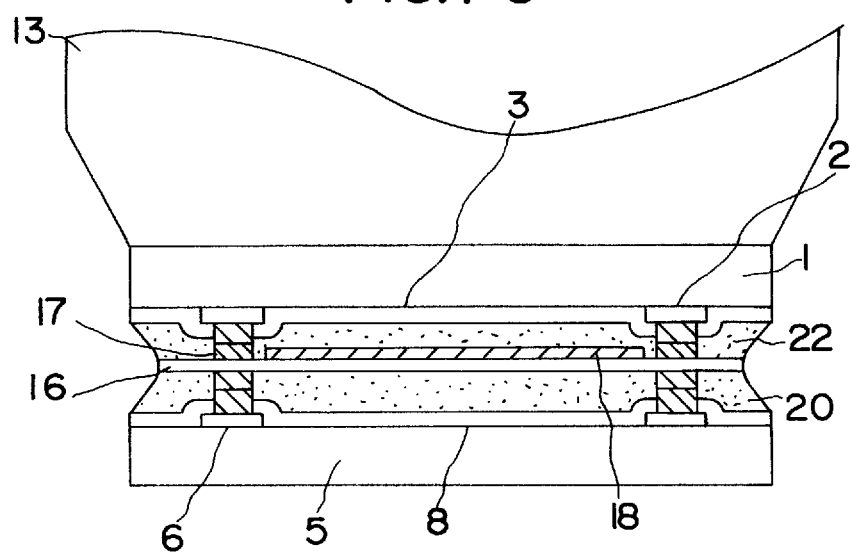

FIG. 6 is a plan view showing the arrangement of metal extrusions 17 formed on insulation film 16 and electro-conductive layer 18. Symbol 19 denotes a metal extrusion to be connected to the ground terminal, among metal extrusions 17 formed on insulation film 16.

FIG. 7 shows process steps of an exemplary method for coupling semiconductor chips of the semiconductor device. In the first place, an insulation resin 20 of acrylic group, epoxy group or silicone group is applied on second semiconductor chip 5, as shown in process (a). Then, as shown in process (b), a polyimide insulation film 16 having a metal extrusion 17 of Au and an electro-conductive layer 18 is disposed with the position aligned on insulation resin 20. Besides Au, metals such as a Ni-core Au, or Sn-Pb, In-Sn solder or the like may be used as the metal extrusion 17. Or, in place of the metal extrusion 17, an electro-conductive extrusion comprising a paste containing electro-conductive filler or the like may be used depending on the particular situation. However, as the electro-conductive extrusion has a higher electrical resistance than the metal extrusion, the latter is preferred.

Then, as shown in process (c), an insulation resin 22 of acrylic group, epoxy group or silicone group is applied on insulation film 16. First semiconductor chip 1 is disposed on insulation resin 22 aligning bump 4a formed on electrode pad 2 with metal extrusion 17 on insulation film 16, as shown in process (d). And then, first semiconductor chip 1 and second semiconductor chip 5 are coupled together by the same method and conditions of pressing/heating as in process (e) of FIG. 3. In a case where insulation film 16 consists of polyethylene or the like whose heat-resisting property is inferior to polyimide, and metal extrusion 17 is consisted of a low temperature solder of Sn-In group solderable at a temperature of several tens of degrees C., first semiconductor chip 1 is mounted on second semiconductor chip 5 by performing the solder alloy junction, at the same time curing insulation resins 20 and 22. If insulation resins 20 and 22 are of a light-curing type insulation resin, first semiconductor chip 1 may be mounted on second semiconductor chip 5 with a pressing/heating tool 13 irradiating ultraviolet rays, thus curing the insulation resins 20 and 22 while pressing first semiconductor chip 1 and second semiconductor chip 5 together. If extrusion 17 is comprised of a paste containing electro-conductive filler, first semiconductor chip 1 is mounted on second semiconductor chip 5 by using a light-curing type insulation resin for the insulation resins 20 and 22, with pressing/heating tool 13 irradiating ultraviolet rays, thus curing insulation resins 20 and 22 while pressing first semiconductor chip 1 and second semiconductor chip 5 together.

In this embodiment, as an electro-conductive layer 18 provided on insulation film 16 is disposed between first semiconductor chip 1 and second semiconductor chip 5, the crosstalk noise can be significantly reduced. Further, as the metal extrusion can be formed in advance on an insulation film by a process apart from the manufacturing process of the semiconductor chip itself, the embodiment is advatageous in volume production.

The ground terminal is formed on either the first semiconductor chip or the second semiconductor chip in the embodiment. The ground terminal may of course be formed on an external circuit. And the same effect is obtained by connecting the terminal with electro-conductive layer 18.

(Embodiment 3)

Figure 8:
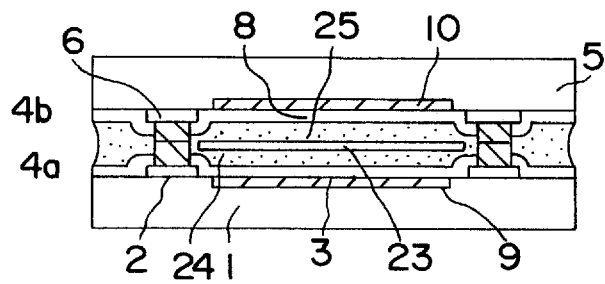
FIG. 8 shows a cross sectional view of a semiconductor device according to a third embodiment of the present invention.
Figure 9A:
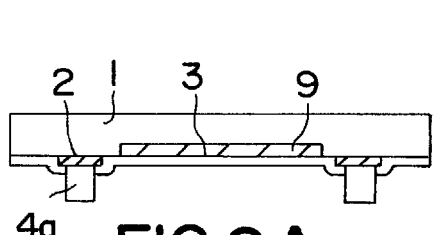
FIG. 9 shows process steps of a semiconductor device manufacturing method of the semiconductor device according to the third embodiment.
Figure 9C:
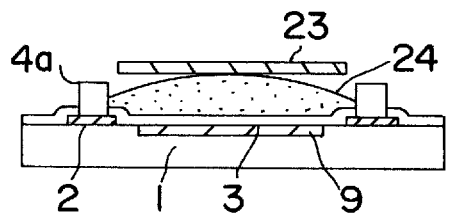
Figure 9B:
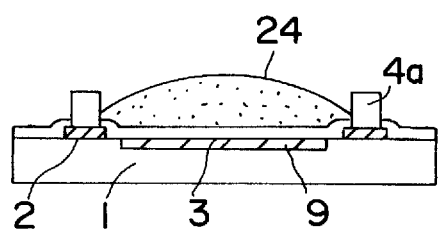
Figure 9D:
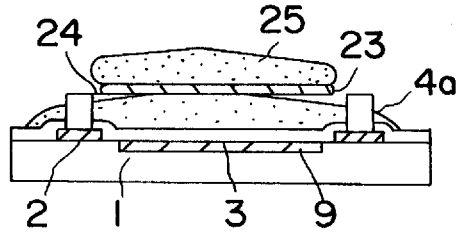
Figure 9E:
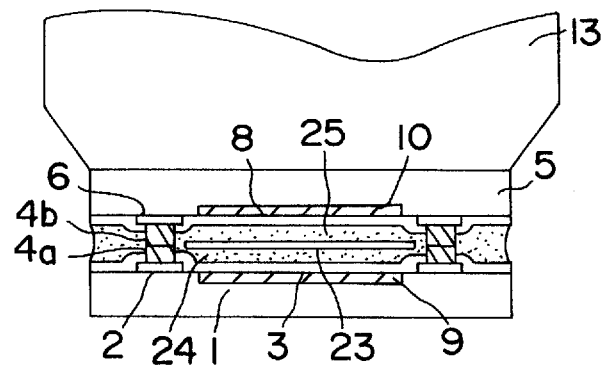

FIG. 8 shows a cross sectional structure of a semiconductor device according to a third embodiment of the present invention. The constituent components in FIG. 8 having the same functions as those in FIG. 1 are referenced with the same symbols, and explanations thereof are omitted. The semiconductor device of FIG. 8 comprises an electro-conductive foil 23 of copper buried in an insulation resin 24, 25, disposed between first semiconductor chip 1 and second semiconductor-chip 5. In place of the copper foil, an aluminum foil or other electro-conductive metal foil may be used as the electro-conductive foil 23.

FIG. 9 shows process steps of a method for coupling semiconductor chips of the semiconductor device. In the first place, a bump 4a of Ni-core Au bump is formed by electroless plating on first electrode pad 2 of first semiconductor chip 1, as shown in process (a). A bump 4b is likewise formed on second electrode pad 6 of second semiconductor chip 5. Besides the Ni-core Au bump, Au or other metal, or solders such as Sn-Pb, In-Sn, etc. may be used for the bump 4a, 4b. Diameter of bumps 4a, 4b is: from 5 $\mu$m to 100 $\mu$m for Ni-core Au bumps and Au bumps, and approximately 100 $\mu$m for solder bumps.

Next, as shown in process (b), an insulation resin 24 of acrylic group, epoxy group or silicone group is applied on a passivation layer 3. Then, as shown in process (c), an electro-conductive foil 23 of copper having a shape covering the surface of first semiconductor chip 1 excluding an area of bump 4a is disposed on insulation resin 24. An insulation resin 25 of acrylic group, epoxy group or silicone group is then applied on electro-conductive foil 23, as shown in process (d).

Then, as shown in process (e), bump 4a is aligned with bump 4b. Using a pressing/heating tool 13, first semiconductor chip 1 and second semiconductor chip 5 are pressed together with a pressure from 0.1 g to 100 g per one bump, and heated at a temperature approximately from 250° C. to 450° C. to form the Au-Au junction. In the case of an Au-Al alloy junction, where a bump is formed on either one of the semiconductor chips 1, 5, the pressing/heating conditions remain the same as in the case of the Au-Au junction. For the solder alloy junction, the temperature range is from 60° C. to 250° C., the pressure is from the self weight of semiconductor chip 5 itself to several grams. In the meantime, insulation resins 24, 25 are simultaneously cured, and second semiconductor chip 5 is coupled on first semiconductor chip 1. If the insulation resins 24, 25 are a light-curing type insulation resin, second semiconductor chip 5 can be mounted on first semiconductor chip 1 with pressing/heating tool 13 irradiating ultraviolet rays, thus the insulation resins 24, 25 are cured while first semiconductor chip 1 and second semiconductor chip 5 are pressed together.

As described above, as the semiconductor device of the present embodiment comprises an electro-conductive foil disposed between two semiconductor chips coupled together by utilizing a metal extrusion, the crosstalk noise that arise between first wiring layer 9 and second wiring layer 10 can be reduced. By disposing an electro-conductive foil in place of an electro-conductive layer employed in the above described embodiments 1 and 2, the present embodiment provides an effect of crosstalk noise reduction in an easier way as compared with the embodiments 1, 2.

(Embodiment 4)

Figure 10:
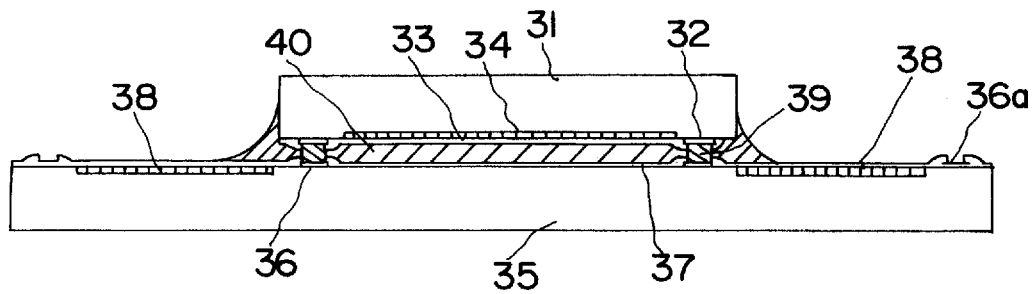
FIG. 10 shows a cross sectional view of a semiconductor device according to a fourth embodiment of the present invention.
Figure 11A:
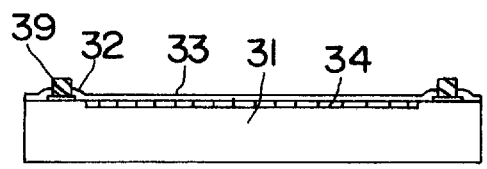
FIG. 11 shows process steps of a semiconductor device manufacturing method of the semiconductor device according to the fourth embodiment.
Figure 11B:
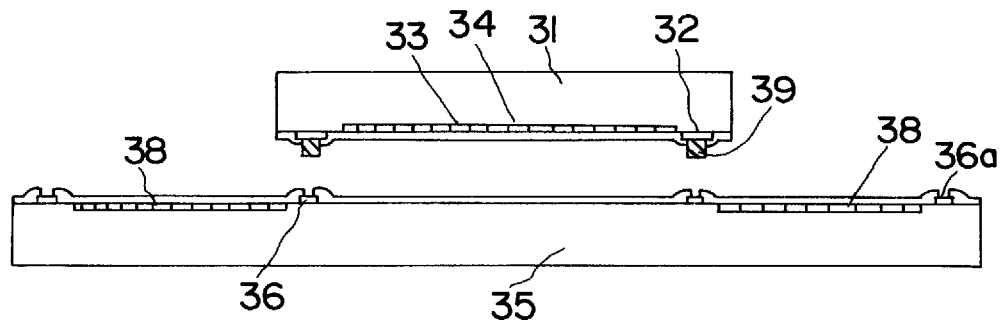
Figure 11C:
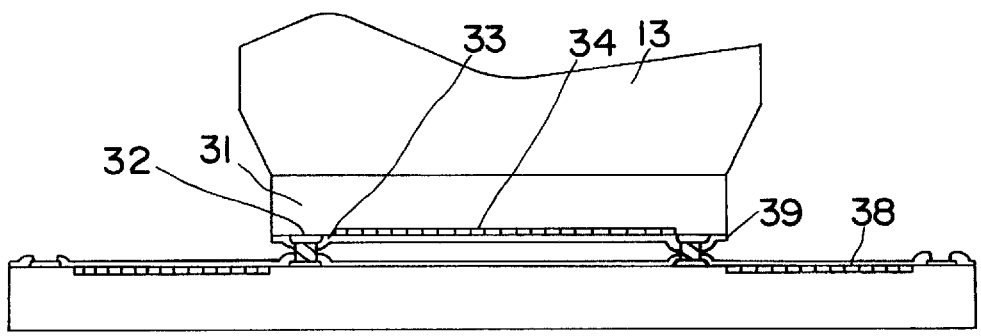
Figure 11D:
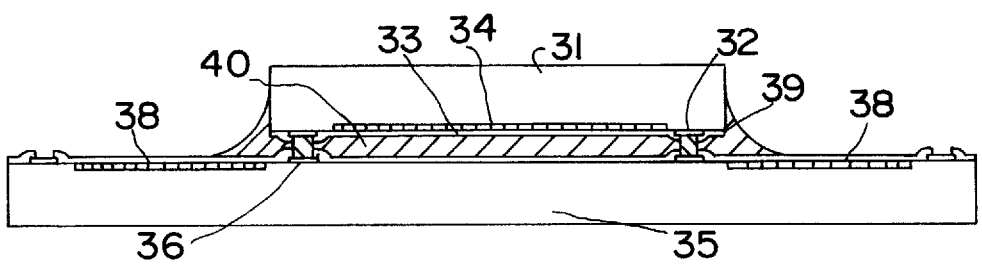

FIG. 10 shows a cross sectional structure at the coupling part of semiconductor chips of a semiconductor device according to a fourth embodiment of the present invention. A first semiconductor chip 31 comprises a first electrode pad 32, a first passivation layer 33 and a first elements region 34 containing wiring layer. A second semiconductor chip 35 has a chip size which is larger than the first semiconductor chip 31, and comprises a second electrode pad 36, a second passivation layer 37, a second elements region 38 containing a wiring layer, and a pad 36a for connection with an external circuit. The second elements region 38 is formed in an area not facing the first semiconductor chip 31. First electrode pad 32 and second electrode pad 36 are electrically connected together by means of a metal extrusion, or a bump 39. The gap between first semiconductor chip 31 and second semiconductor chip 35 including their vicinities are filled with an insulation resin 40. The insulation resin 40 is not an essential component, but it may be used whenever necessary.

FIG. 11 shows process steps of mounting two semiconductor chips of the semiconductor device.

In the first place, as shown in process (a), a bump 39 of Ni-core Au is formed by electroless plating on electrode pad 32 of first semiconductor chip 31. Bump 39 may be either an Au bump, or a solder bump comprising Sn-Pb, In-Sn, etc. It may be formed also by a transfer bump method. The diameter of bump 39 is: from 5 $\mu$m to 100 $\mu$m for Ni-core Au bumps and Au bumps; and approximately 100 $\mu$m for solder bumps. Bump 39 may be formed on both first semiconductor chip 31 and second semiconductor chip 35.

Next, as shown in process (b), first electrode pad 32 is aligned with second electrode pad 36 via bump 39. Then, first semiconductor chip 31 is mounted on second semiconcuctor chip 35 using a pressing/heating tool 13. The chips are pressed together with a pressure from 0.1 g to 100 g per one bump, and at a temperature within a range from 60° C. to 250° C. to obtain the Au-Al alloy junction. In the case of the Au-Au junction, the pressing/heating conditions remain the same as in the Au-Al alloy junction. In a case of the solder alloy junction, the heating temperature is within a range from 60° C. to 250° C., and the pressure is from the weight of semiconductor chip itself to several grams. Besides the alloy junction method, a flip chip method such as M B B(micro bump bonding) method well known as C O G method, wherein the coupling is performed via an insulation resin, may be used.

Then, as process (d) shows, the gap between first semiconductor chip 31 and second semiconductor chip 35 and their vicinities are filled with an insulation resin 40, and cured. If the insulation resin 40 is a light-curing type insulation resin, second semiconductor chip 35 may be mounted on first semiconductor chip 31 irradiating ultraviolet rays, thus insulation resin is cured while first semiconductor chip 31 and second semiconductor chip 35 are pressed together by pressing/heating tool 13.

As described above, as there is no second elements region 38, including the wiring layer, in an area beneath first elements region 34, the occurrence of crosstalk noise between first elements region 34 and second elements region 38 is suppressed.

(Embodiment 5)

Figure 12:
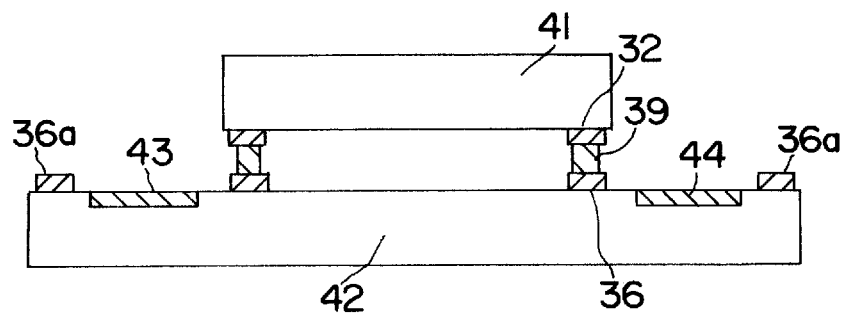
FIG. 12 shows a cross sectional view of a semiconductor device according to a fifth embodiment of the present invention.

A fifth embodiment of the present invention as shown in FIG. 12 is a modification of the fourth embodiment shown in FIG. 10. An E P R O M(erasable programmable read-only memory) module comprised of a second semiconductor chip 42 containing memory circuits and logic circuits, and a first semiconductor chip 41, which comprises a general-use M C U(micro-computer), is mounted on the second semiconductor chip 42. The constituent components in FIG. 12 having the same functions as those of FIG. 10 are reference with the same symbols, and explanations thereof are omitted. An E P R O M 43 and a logic circuit 44 are formed in an area not facing the second semiconductor chip 42. The logic circuit 44 may contain other memories. Also in this embodiment, an insulation resin 40 may be filled in, wherever necessary, as shown in FIG. 10.

The method of coupling first semiconductor chip 41 and second semiconductor chip 42 together remains the same as that of FIG. 11, processes (a)–(c); therefore explanation thereof is omitted.

In this embodiment, as the E P R O M 43 and logic circuit 44 are formed in an area of second semiconductor chip 42 not facing the first semiconductor chip 41, the occurrence of crosstalk noise is suppressed even without providing an electro-conductive layer. Furthermore, different from a conventional semiconductor device wherein an E P R O M is formed beneath the first semiconductor chip, the E P R O M 43 of this embodiment is placed with its surface open upwardly; therefore, programs and data stored in E P R O M 43 can be erased with ease by irradiating ultraviolet rays from above, and rewritten. In a case where at least E P R O M 43 is located so as to not be overlaid by first semiconductor chip 41, the erasing by ultraviolet rays is possible. In a case where logic circuit 44 is formed beneath first semiconductor chip 41, the occurrence of crosstalk noise can be suppressed by disposing an electro-conductive layer between first semiconductor chip 41 and second semiconductor chip 42.

(Embodiment 6)

Figure 13:
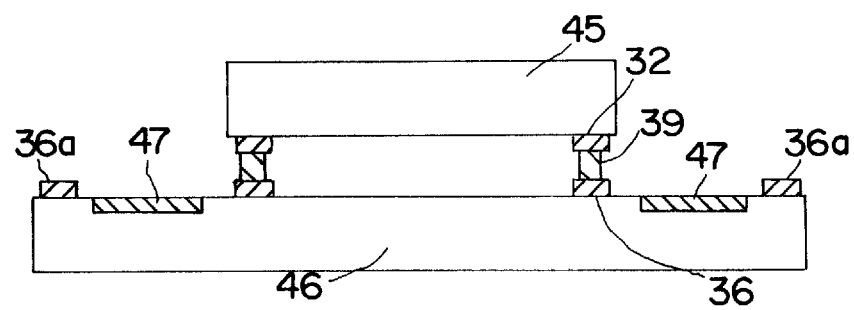
FIG. 13 shows a cross sectional view of a semiconductor device according to a sixth embodiment of the present invention.

A sixth embodiment of the present invention shown in FIG. 13 is another modification of the fourth embodiment as shown in FIG. 10. The embodiment includes an I C E(in-circuit emulator) module comprising a second semiconductor chip 46 comprised of an I C E chip, and a first semiconductor chip 45 comprised of a general-use M C U (micro-computer) which is mounted on the second semiconductor chip 46. The constituent components of FIG. 13 having the same functions as those in FIG. 10 are referenced with the same symbols, and explanations thereof are omitted. A circuit 47 comprised of an I C E circuit and a memory is formed on second semiconductor chip 46 in an area not facing the first semiconductor chip 45. A pad 36a is a user external pad, and the total number of pads 36 plus pad 36a is larger than the number of first electrode pads 32. The circuit 47 is formed so that the square measure of circuit 47 is smaller than the area of second semiconductor chip 46 minus the area of the general-use M C U.

The method of coupling first semiconductor chip 45 and second semiconductor chip 46 together remains the same as that shown in FIG. 11, i.e. processes (a) through (c), and therefore explanation thereof is omitted.

The occurrence of crosstalk noise is suppressed also in this embodiment because the circuit 47 comprising the I C E circuit and memory is formed on second semiconductor chip 46 in an area not facing the first semiconductor chip 45.

(Embodiment 7)

Figure 14:
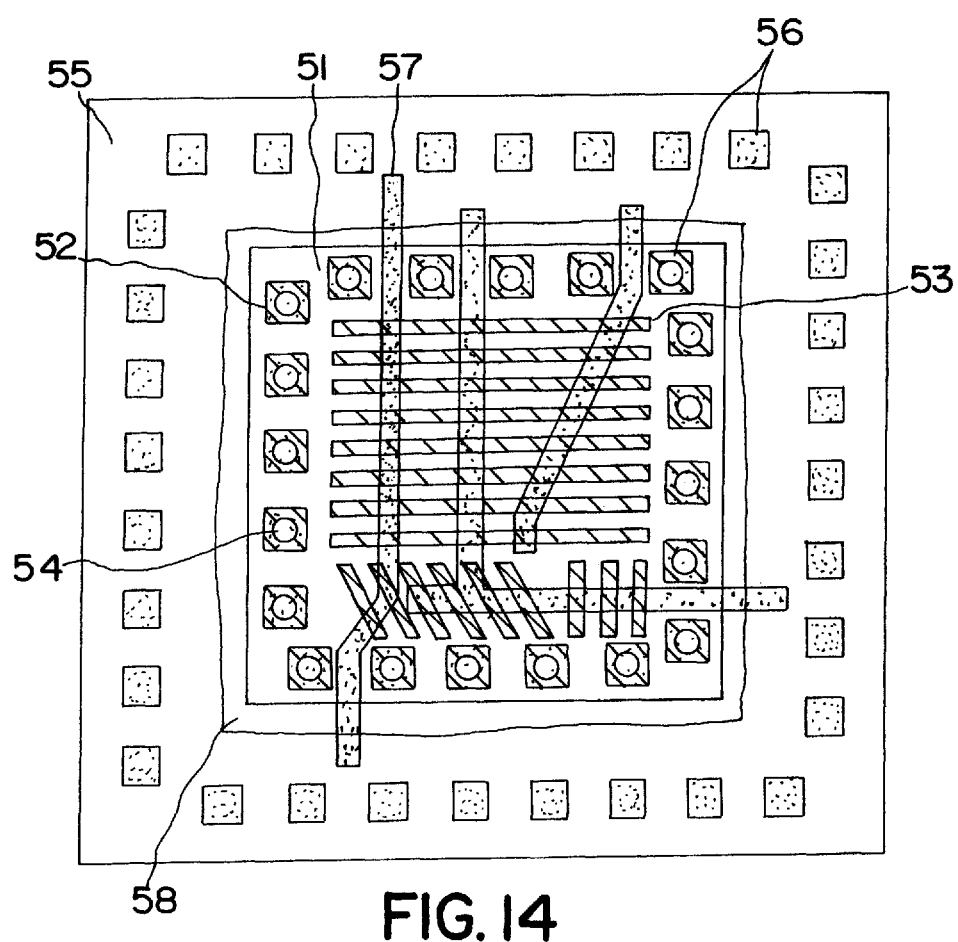
FIG. 14 shows a see-through plan view of a semiconductor device according to a seventh embodiment.

FIG. 14 is a see-through plan view of a semiconductor device according to a seventh embodiment of the present invention. as viewed from above. On a first semiconductor chip 51, 52 and a first wiring 53 are formed. On a second semiconductor chip 55, a second electrode pad 56 and a second wiring 57 are formed. The first semiconductor chip 51 and the second semiconductor chip 55 are positioned in a manner so that the direction of wiring 53 and the direction of wiring 57 form approximately a right angle. First electrode pad 52 and second electrode pad 56 are coupled by a metal extrusion, or a bump 54. The gap between first semiconductor chip 51 and second semiconductor chip 55, and their vicinities are filled with an insulation resin 58. The insulation resin 58 is not an essential member, but it may be provided whenever needed.

Method of coupling first semiconductor chip 51 and second semiconductor chip 55 together remains the same as that of FIG. 11, i.e. processes (a) through (d), and therefore explanation thereof is omitted.

Thus, the crosstalk noise that occurs between wiring 53 and wiring 57 is significantly reduced by arranging the positioning of first semiconductor chip 51 and second semiconductor chip 55 so that the direction of wiring 53 and the direction of wiring 57 cross at approximately right angles to each other. The crosstalk noise increases along with deviation of the crossing angle of the directions of wiring 53 and wiring 57 from the right angle. Therefore, it is most preferred to have the direction of wiring 53 and the direction of wiring 57 cross at approximately right angles. However, it is not the intention of the present invention to limit the positioning arrangement to a right angle, but the crossing angle between the direction of wiring 53 and the direction of wiring 57 may be made smaller than the right angle in so far as the level of crosstalk noise is lower than a level at which a functional error is induced on the semiconductor device. When directions of the two wirings are in parallel to each other the crosstalk noise reaches its peak, and therefore, such an arrangement is the least preferred.

(Embodiment 8)

Figure 15A:
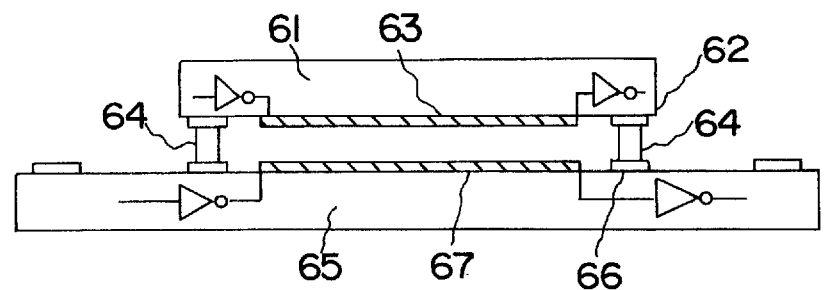
FIG. 15(a) shows an outline concept of a semiconductor device according to an eighth embodiment of the present invention.

FIG. 15(a) is a conceptual drawing showing the cross section and the circuit of a semiconductor device according to an eighth embodiment of the present invention. A first electrode pad 62 and a first wiring 63 are formed on a first semiconductor chip 61. A second electrode pad 66 and a second wiring 67 are formed. The first electrode pad 63 and the second electrode pad 66 are coupled together via a metal extrusion, or a bump 64, so that first wiring 63 and second wiring 67 do not touch each other. The method of coupling first semiconductor chip 61 and second semiconductor chip 65 remains the same as that of FIG. 11, i.e. processes (a) through (c), and therefore explanation thereof is omitted.

Figure 15B:
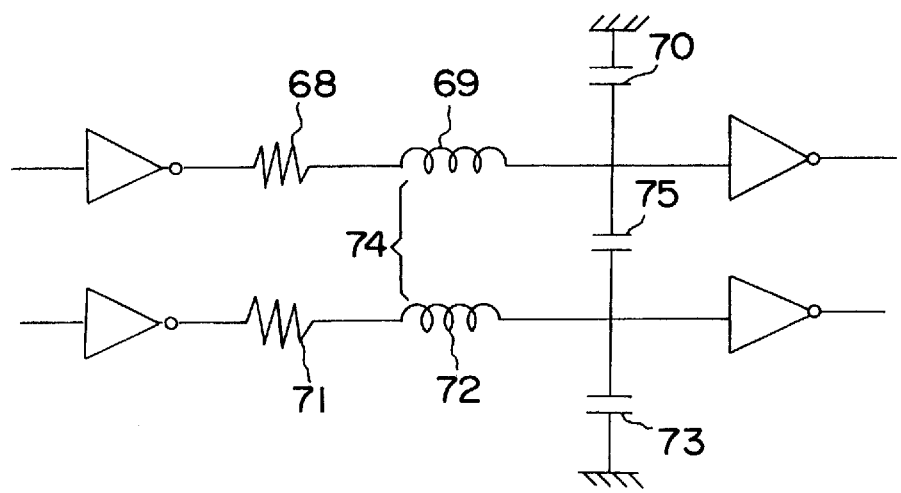
FIG. 15(b) an equivalent circuit diagram between the wirings of the semiconductor device.

FIG. 15(b) shows an equivalent circuit diagram, where each length of first wiring 63 and second wiring 67 is 1 mm, and wiring 63 and wiring 67 are in parallel to each other. In FIG. 15(b) shows a resistance 68, an inductance 69 and a capacitance 70 against substrate of first wiring 63; a resistance 71, an inductance 72 and a capacitance 73 against substrate of second wiring 67; and a mutual inductance 74 and a mutual capacitance 75 between wiring 63 and wiring 67.

In this embodiment, in order to suppress the crosstalk noise induced by mutual inductance 74 and mutual capacitance 75, the difference between driving voltage of first semiconductor chip 61 and driving voltage of second semiconductor chip 65 is made to be smaller than threshold voltage of either one of the semiconductor chips, the driving voltage of which is lower. For example, assuming the driving voltage of second semiconductor chip 65 to be 2V, and the ON and OFF is determined at 1V as the border, the driving voltage of first semiconductor chip 61 is set to be under 3V. In this case, the difference between the two driving voltages is under 1V, or smaller than the threshold voltage 1V; therefore the crosstalk noise diminishes.

Figure 16:
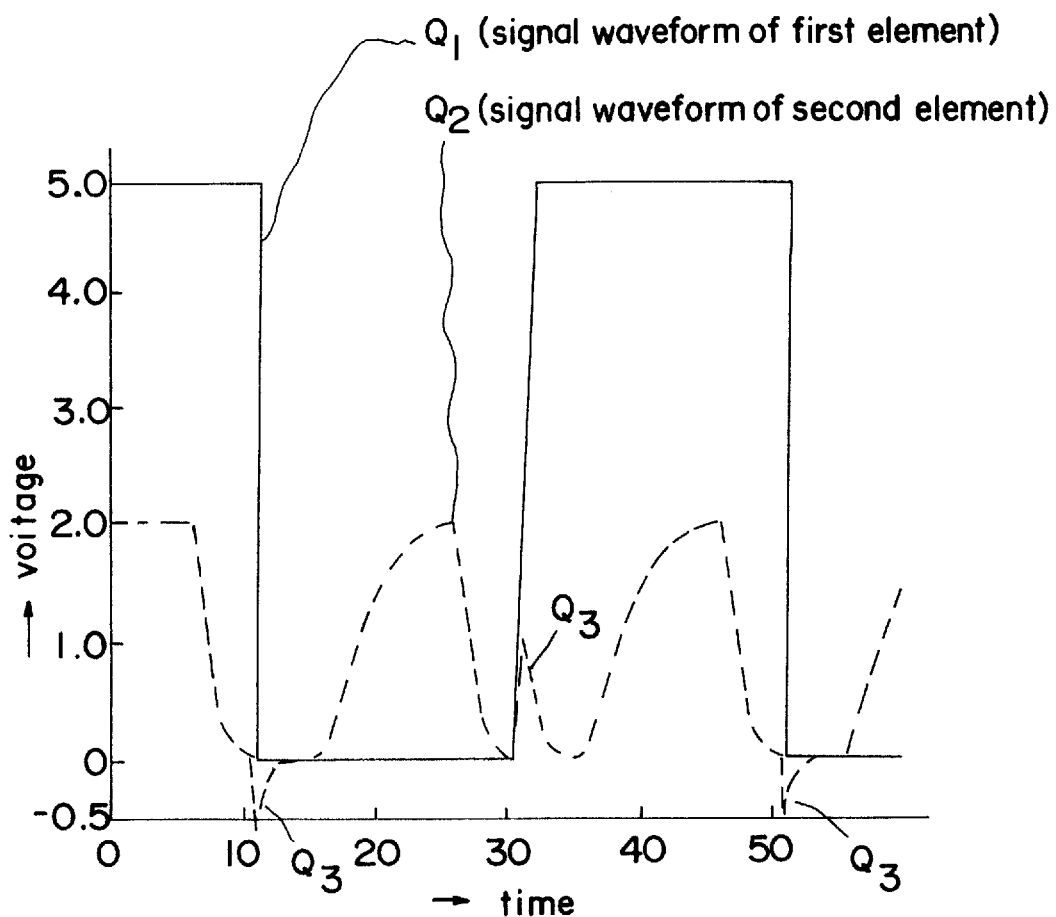
FIG. 16 is a characteristics chart showing the relationship of signal waveforms when different driving voltages are applied on a first semiconductor chip and a second semiconductor chip in a comparative case.

For the purpose of comparison, FIG. 16 shows the occurrence of crosstalk noise Q3 immediately before each respective input buffer; where driving voltage Q2 of second semiconductor chip 65 is 2V, and driving voltage Q1 of first semiconductor chip 61 is 5V. In this case, the difference between the driving voltages is 3V, or larger than the lower driving voltage Q2 and evidently higher than the threshold value; therefore, it is seen that substantial crosstalk noise Q3 is induced on wiring 67 of second semiconductor chip 65.

Figure 17:
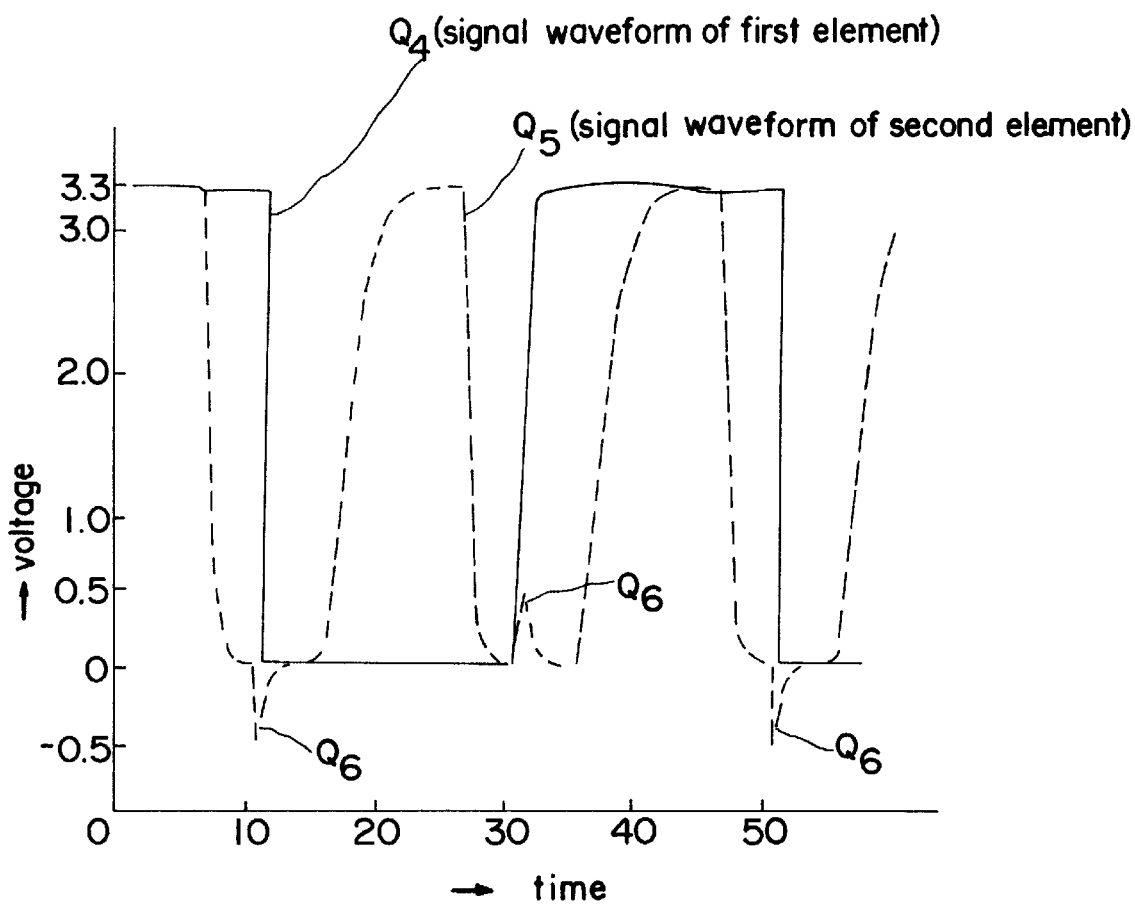
FIG. 17 is a characteristics chart showing the relationship of signal waveforms when a same driving voltage is applied on a first semiconductor chip and a second semiconductor chip of the eighth embodiment of the present invention.
Figure 18:
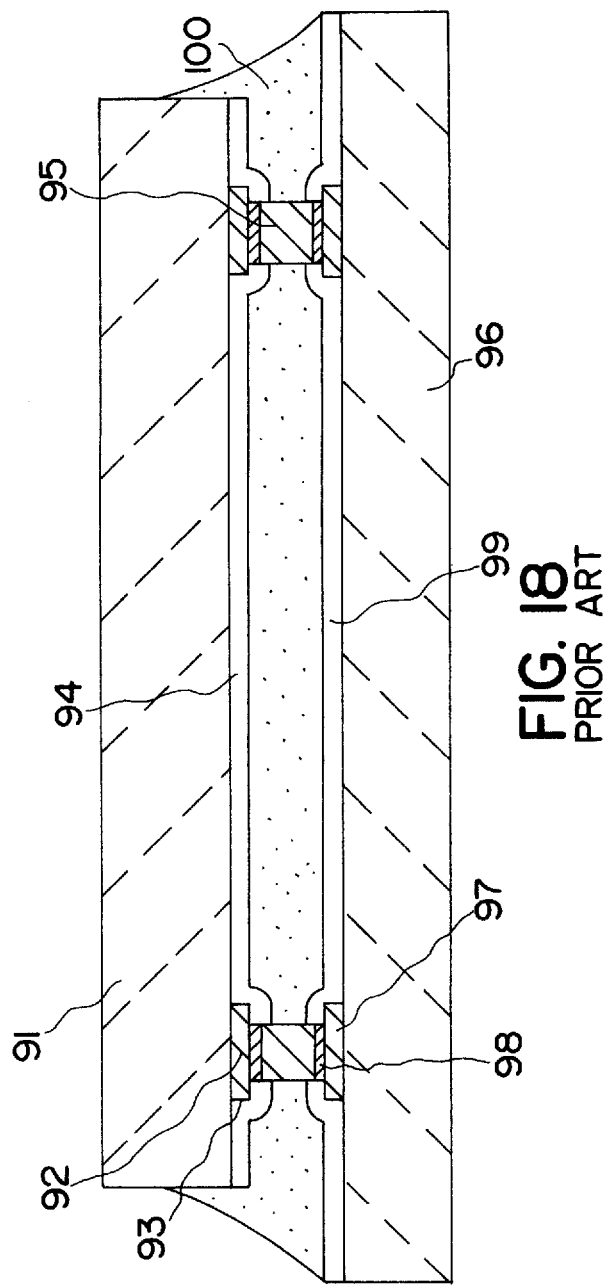
FIG. 18 shows a cross sectional view of a prior art semiconductor device.
Figure 19A:
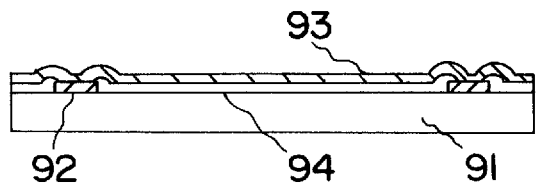
FIG. 19 shows process steps of a prior art semiconductor device manufacturing method.
Figure 19B:
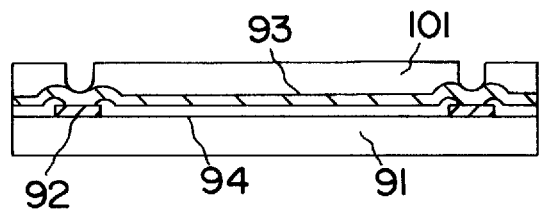
Figure 19C:
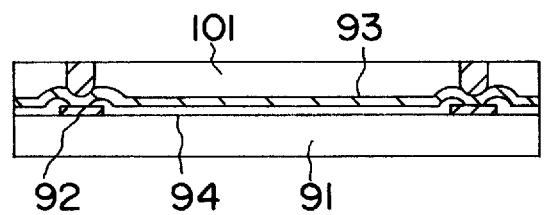
Figure 19D:
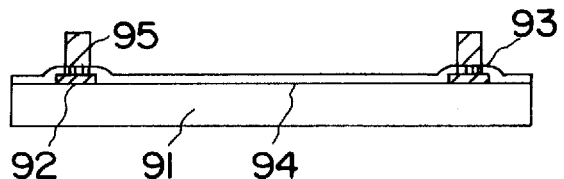
Figure 19E:
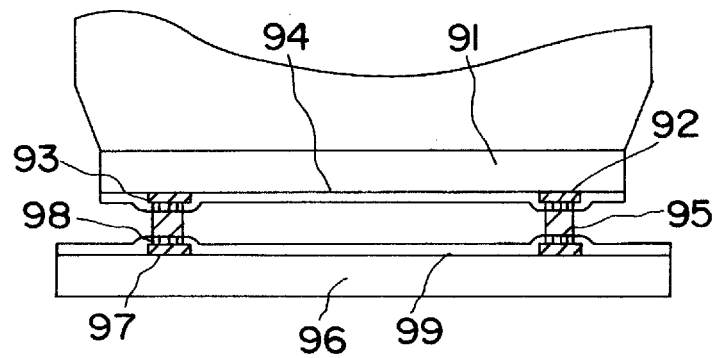
Figure 19F:
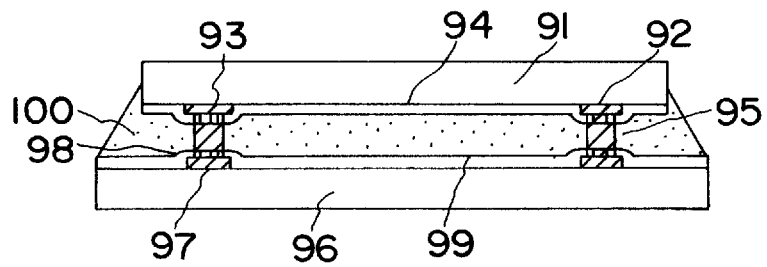

As a practical example of this embodiment, FIG. 17 shows the occurrence of crosstalk noise Q6 immediately before each respective input buffer; where driving voltage Q4 of first semiconductor chip 61 and driving voltage Q5 of second semiconductor chip 65 are both 3.3V. In this case, the difference between the driving voltages is 0V, or evidently smaller than the threshold value; therefore, it is seen that the level of crosstalk noise Q6 is too low to on influence on operation of the semiconductor device.

As described above, in a constitution where first semiconductor chip 61 and second semiconductor chip 65 are disposed facing to each other, and electrially coupled via bump 64, the crosstalk noise that occurs between the wirings of first semiconductor chip 61 and second semiconductor chip 65 can be reduced to a level so as not to cause an erroneous operation of the semiconductor device, if the difference between driving voltage of first semiconductor chip 61 and driving voltage of second semiconductor chip 65 is smaller than thershold voltage of either one of the semiconductor chips having the lower driving voltage.

Although the present invention has been described in terms of the presently preferred embodiments, it is to be understood that such disclosure is not to be interpreted as limiting. Various alterations and modifications will no doubt become possible. Accordingly, it is intended that the appended claims be interpreted as covering all alterations and modifications as fall within the true spirit and scope of the invention.

What is claimed is:

1. A semiconductor device comprising:

a first semiconductor chip having a wiring layer disposed in a first surface of said first semiconductor chip;

a plurality of first electrode pads disposed on said first surface of said first semiconductor chip;

a second semiconductor chip having a wiring layer disposed in a first surface of said second semiconductor chip, wherein said first surface of said first semiconductor chip confronts said first surface of said second semiconductor chip;

a plurality of second electrode pads disposed on said first surface of said second semiconductor chip;

a plurality of coupling members for electrically coupling said first electrode pads and said second electrode pads together;

an insulation member disposed between said confronting first surfaces of said first semiconductor chip and said second semiconductor chip, wherein said insulation member comprises an insulation resin which fills a gap between said confronting surfaces of said first and second semiconductor chips so as to bond said chips together; and an electro-conductive member disposed between said confronting first surfaces of said first semiconductor chip and said second semiconductor chip so as to reduce crosstalk therebetween, wherein said electro-conductive member comprises an electro-conductive foil embedded in said insulation resin.

2. A semiconductor device comprising:

a first semiconductor chip having a first wiring layer and a first elements region in a first surface of said first semiconductor chip;

a plurality of first electrode pads disposed on said first surface of said first semiconductor chip;

a second semiconductor chip having a second wiring layer and a second elements region in a first surface of second semiconductor chip, wherein said first surface of said second semiconductor chip confronts said first surface of said first semiconductor chip; and a plurality of second electrode pads disposed on said first surface of said second semiconductor chip, said second electrode pads being positioned so as to correspond to said first electrode pads, wherein said first semiconductor chip is positioned relative to said second semiconductor chip so that wiring of said first wiring layer crosses wiring of said second wiring layer at a predetermined angle without having mutual contact.

3. A semiconductor device comprising:

a first semiconductor chip having a first wiring layer and a first elements region in a first surface of said first semiconductor chip;

a plurality of first electrode pads disposed on said first surface of said first semiconductor chip;

a second semiconductor chip having a second wiring layer and a second elements region in a first surface of said second semiconductor chip, wherein said first surface of said second semiconductor chip confronts said first surface of said first semiconductor chip; and a plurality of second electrode pads disposed on said first surface of said second semiconductor chip, said second electrode pads being positioned so as to correspond to said first electrode pads, wherein a difference between a driving voltage of said first semiconductor chip and a driving voltage of said second semiconductor chip is smaller than a threshold voltage that determines ON and OFF of one said first and second semiconductor chips which has a lower driving voltage.

\* \* \* \* \*